(12) United States Patent
Kang et al.

(10) Patent No.: US 8,987,092 B2
(45) Date of Patent: Mar. 24, 2015

(54) METHODS FOR FABRICATING MEMORY CELLS HAVING FIN STRUCTURES WITH SEMICIRCULAR TOP SURFACES AND ROUNDED TOP CORNERS AND EDGES

(75) Inventors: Inkuk Kang, San Jose, CA (US); Gang Xue, Sunnyvale, CA (US); Shenqing Fang, Fremont, CA (US); Rinji Sugino, San Jose, CA (US); Yi Ma, Santa Clara, CA (US)

(73) Assignee: Spansion LLC, Sunnyvale, CA (US)

( * ) Notice: Subject to any disclaimer, the term of this patent is extended or adjusted under 35 U.S.C. 154(b) by 55 days.

(21) Appl. No.: 12/110,974

(22) Filed: Apr. 28, 2008

(65) Prior Publication Data
US 2009/0269916 A1 Oct. 29, 2009

(51) Int. Cl.
H01L 21/336 (2006.01)
H01L 27/115 (2006.01)
H01L 29/66 (2006.01)
H01L 29/78 (2006.01)

(52) U.S. Cl.
CPC .... H01L 27/11568 (2013.01); H01L 29/66795 (2013.01); H01L 29/7854 (2013.01)
USPC .......................................................... 438/283

(58) Field of Classification Search
CPC .................................................. H01L 21/845
USPC ................................... 257/E29.264; 438/283
See application file for complete search history.

(56) References Cited

U.S. PATENT DOCUMENTS

| | | | |
|---|---|---|---|
| 6,992,006 B2 * | 1/2006 | Otsuka et al. ................. | 438/687 |
| 2003/0068885 A1 * | 4/2003 | Cheong ......................... | 438/674 |
| 2003/0073264 A1 * | 4/2003 | Meguro et al. ................ | 438/113 |
| 2004/0126985 A1 * | 7/2004 | Bendernagel et al. ........ | 438/411 |
| 2007/0134860 A1 * | 6/2007 | Yang et al. .................... | 438/164 |
| 2008/0087946 A1 * | 4/2008 | Hsu et al. ...................... | 257/328 |

FOREIGN PATENT DOCUMENTS

KR   10-2004-0107942   *   6/2006  ........... H01L 21/336

OTHER PUBLICATIONS

KR 10-2004-0107942; Jun. 2006; Korea; Jeong, Seon; H01L 21/336 (English Translation).*

* cited by examiner

*Primary Examiner* — Yu-Hsi D Sun

(57) ABSTRACT

Methods for fabricating a FIN structure with a semicircular top surface and rounded top surface corners and edges are disclosed. As a part of a disclosed method, a FIN structure is formed in a semiconductor substrate. The FIN structure includes a top surface having corners and edges. The FIN structure is annealed where the annealing causes the top surface to have a semicircular shape and the top surface corners and edges to be rounded.

16 Claims, 18 Drawing Sheets

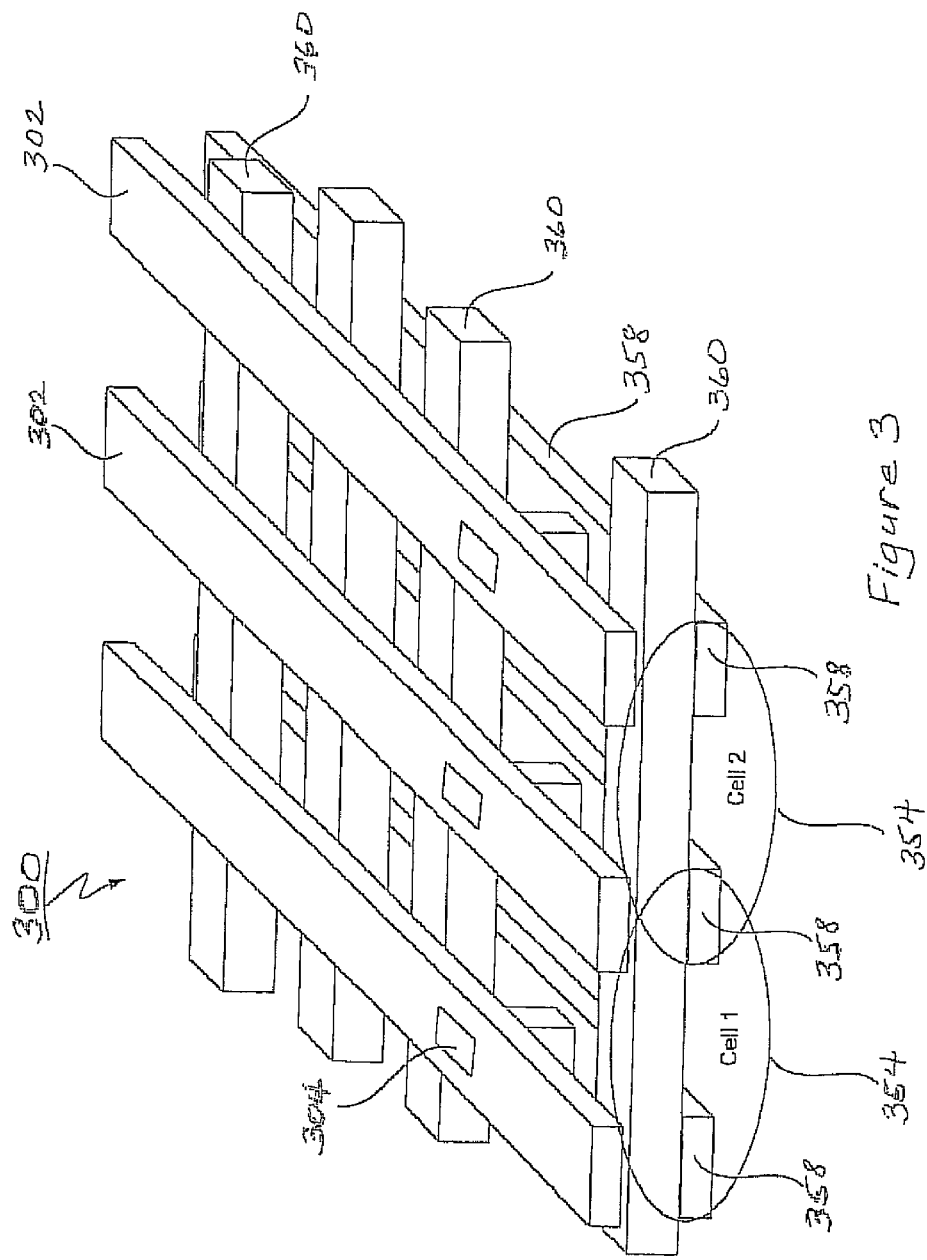

US 8,987,092 B2

METHODS FOR FABRICATING MEMORY CELLS HAVING FIN STRUCTURES WITH SEMICIRCULAR TOP SURFACES AND ROUNDED TOP CORNERS AND EDGES

FIELD OF THE INVENTION

The present invention relates to the fabrication of memory cells.

BACKGROUND

Consumer electronic products such as televisions, digital cameras, cellular telephones, media content players, etc., help to satisfy consumer demand for basic communications and entertainment services. Data storage components play an important role in the operation of these devices. Data storage devices include RAM, ROM, flash memory products, etc.

An important feature of data storage devices is memory cell density. There are many approaches to increasing the memory cell density of memory arrays. One approach involves reducing the channel length between the source and the drain of transistors associated with memory cells in a memory array. This allows the size of each memory cell to be reduced which in turn facilitates the provision of denser memory arrays. Another approach to increasing memory cell density is embodied in a commercially available flash memory product called MirrorBit™ Technology from Spansion, located in Sunnyvale, Calif.

In flash memory arrays that use MirrorBit technology, the use of MirrorBit memory cells effectively doubles their intrinsic density by storing two physically distinct bits on opposite sides of the memory cells. Each bit that is stored within a cell serves as a binary unit of data (either a logic one or zero) that is mapped directly to the memory array.

An exemplary MirrorBit TM memory device includes a semiconductor substrate with spaced apart source and a drain regions (both typically having N-type conductivity) formed in a substrate. An oxide-nitride-oxide (ONO) layered stack is formed on the top surface of the substrate between the source and drain regions. A gate electrode, which typically comprises an N or N+ polysilicon layer, is formed over the ONO stack. The ONO stack includes a first or bottom dielectric layer (often referred to as a bottom tunnel oxide), a charge storing nitride layer, and a second or top dielectric layer of oxide.

Some challenges associated MirrorBit™ devices are related to structural and functional features of the device. For example, it can be difficult to reduce the size or pitch of the cell because the storage element of the above-mentioned flash memory cell can be planar (the oxide, nitride and oxide layers are all horizontal layers formed one on top of the other on the silicon substrate). Moreover, as it regards operations such as the erasure of a MirrorBit™ cell such as by hot hole injection, because hot holes bombard the interface between the substrate and the bottom tunnel oxide, the interface as well as the bottom tunnel oxide can be damaged causing undesirable interface states and degraded reliability over program/erase cycling.

Conventional fabrication methodologies can provide results that can affect the operation of the fabricated MirrorBit™ devices. Problematic features of devices fabricated from conventional methodologies include sharp corners in FIN structure between top surface and sidewalls that contribute to early breakdown at the corners due to enhanced electric field.

FIG. 1 shows a conventional FINFET ONO memory structure 100. Memory structure 100 includes FIN structure 101, bottom oxide 103, nitride layer 105 and top oxide 107. As discussed above, sharp corners (see encircled sharp corners A and B in FIG. 1) in the FIN structure between its top surface and sidewalls can contribute to breakdown of bottom oxide 103 at these points. Referring again to FIG. 1, even though an electric field can be uniformly provided the electric field that results can be concentrated and more intense at the corners of the FIN structure. As a result the likelihood of a breakdown of the bottom oxide 103 at such points is greater. It should be appreciated that a breakdown of bottom oxide 103 can cause a loss of charge for the charge storage cell structure. As a result, the programmed data can be lost.

As can be seen from the above discussion, conventional approaches to fabricating memory cells can be inadequate. These approaches can precipitate undesirable consequences that negatively affect device function and degrade reliability.

SUMMARY OF THE INVENTION

Methods for fabricating a FIN structure with semicircular top surface and rounded top surface corners and edges are disclosed. As a part of a disclosed method, a FIN structure is formed in a semiconductor substrate. The FIN structure includes a top surface that has corners and edges. The FIN structure is annealed where the annealing causes the top surface to have a semicircular shape and the top surface corners and edges to be rounded.

BRIEF DESCRIPTION OF THE DRAWINGS

The invention, together with further advantages thereof, may best be understood by reference to the following description taken in conjunction with the accompanying drawings in which:

FIG. 3 shows an array architecture that employs memory cells such as described with reference to FIG. 2A according to the one embodiment of the present invention.

It should be noted that like reference numbers refer to like elements in the figures.

DETAILED DESCRIPTION OF THE INVENTION

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention.

Figure 1:
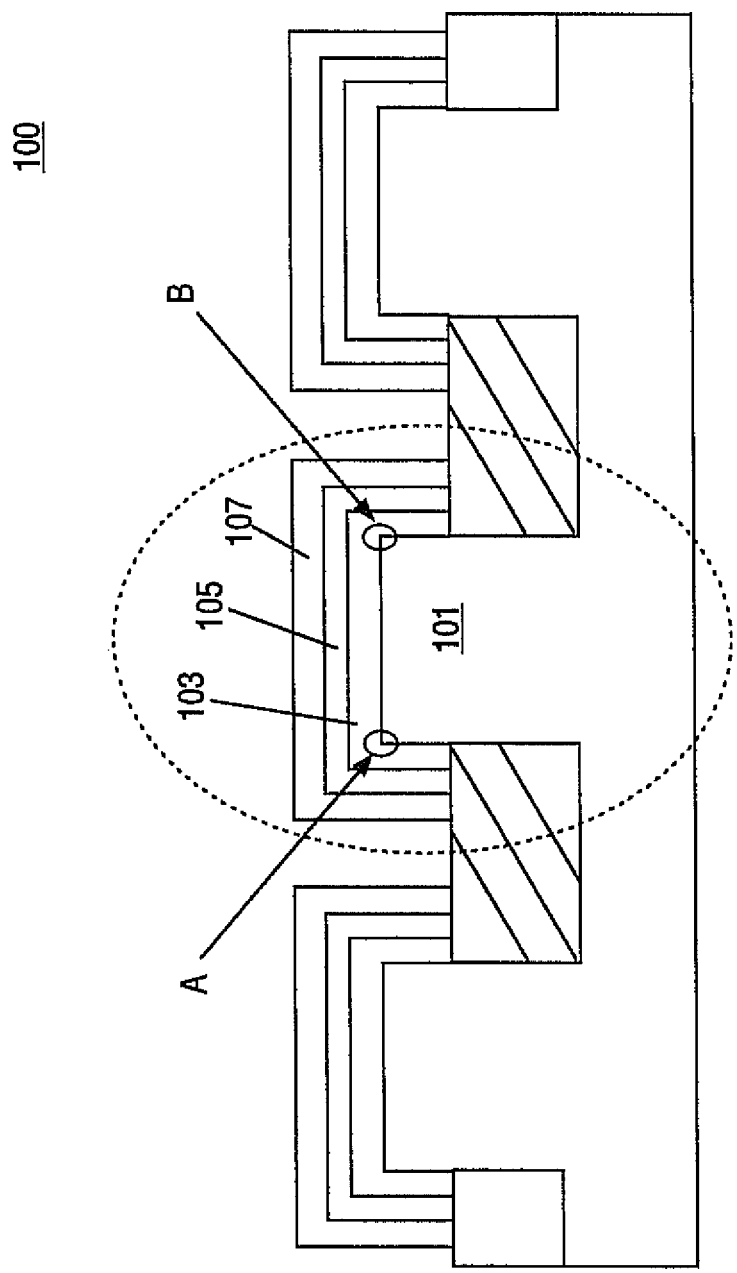
FIG. 1 is a cross section of a conventional FINFET memory cell according to the one embodiment of the present invention.
Figure 2A:
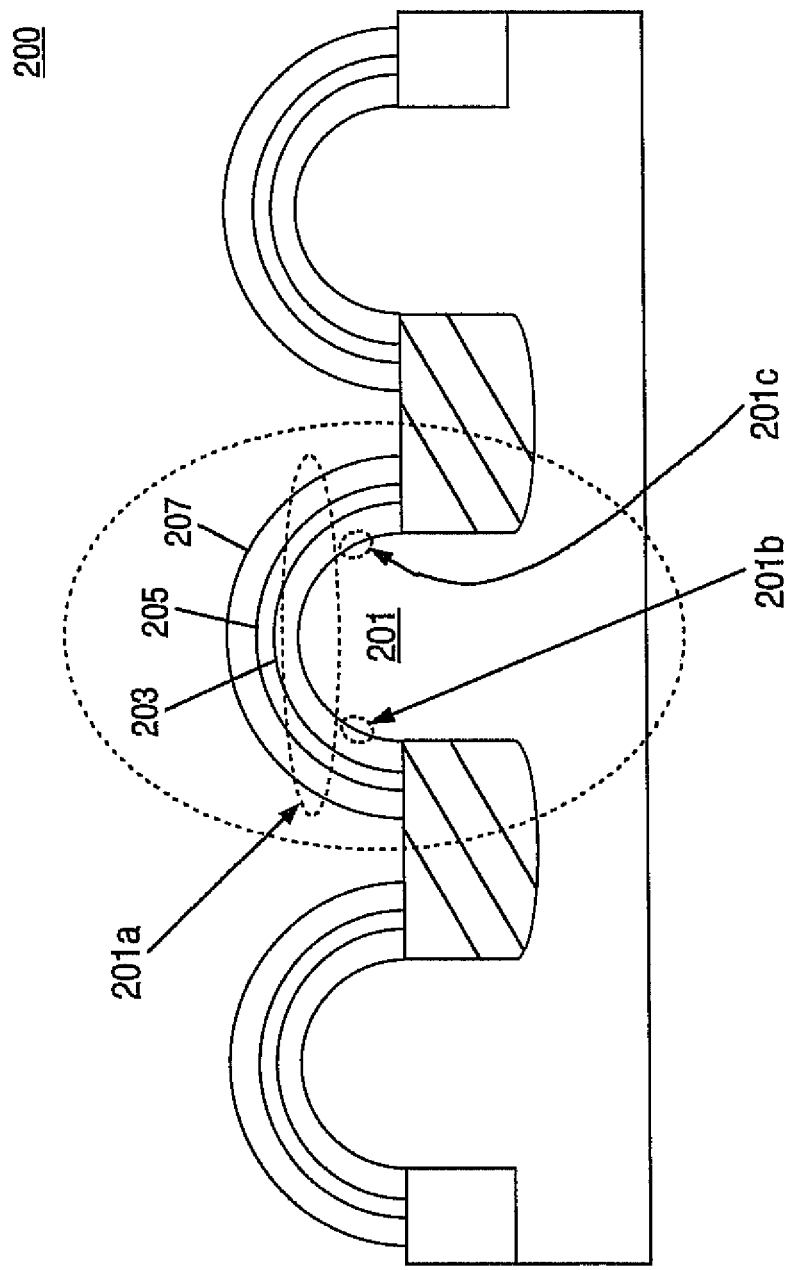
FIG. 2A is a cross section of a memory cell according to the one embodiment of the present invention.

Methods for Fabricating Memory Cells having FIN Structures with Semicircular Top Surfaces and Rounded Top Corners and Edges FIG. 2A shows a cross section of a plurality of memory cell components 200 formed from FIN structures 201 with semicircular top surfaces 201a and rounded top corners and edges 201b and 201c respectively according to one embodiment of the invention. In one embodiment, the semicircular top surface 201a and rounded top corners and edges 201b and 201c respectively of the FIN structures 201 inhibit the type of oxide breakdown that can occur at top surface corners of FIN structures that possess sharp top surface corners edges. It should be appreciated that the semicircular top surfaces 201a and rounded top corners and edges 201b and 201c of the FIN structures 201 shown in FIG. 2A provide a memory cell structure that is resistant to breakdown and is thus highly reliable. In the FIG. 2A embodiment, memory cell components 200 include silicon FIN structure 201, nitride charge storage layer 205, bottom oxide layer 203 and top oxide layer 207 (see encircled elements).

Referring to FIG. 2A, silicon FIN structure 201 is formed from silicon and is the initial element of the memory cell structure formed in the memory cell fabrication process. Oxide layer 203 is formed over silicon FIN structure 201 and forms an interface therewith. Nitride charge storage layer 205 is formed over and constitutes the charge storage element of memory cell components 200. Top oxide layer 207 is formed over nitride charge storage layer 205 and forms an interface therewith. In one embodiment, a polycrystalline layer (not shown) can be formed over top oxide layer 207 to provide a SONOS three dimensional memory cell structure.

Figure 2B:
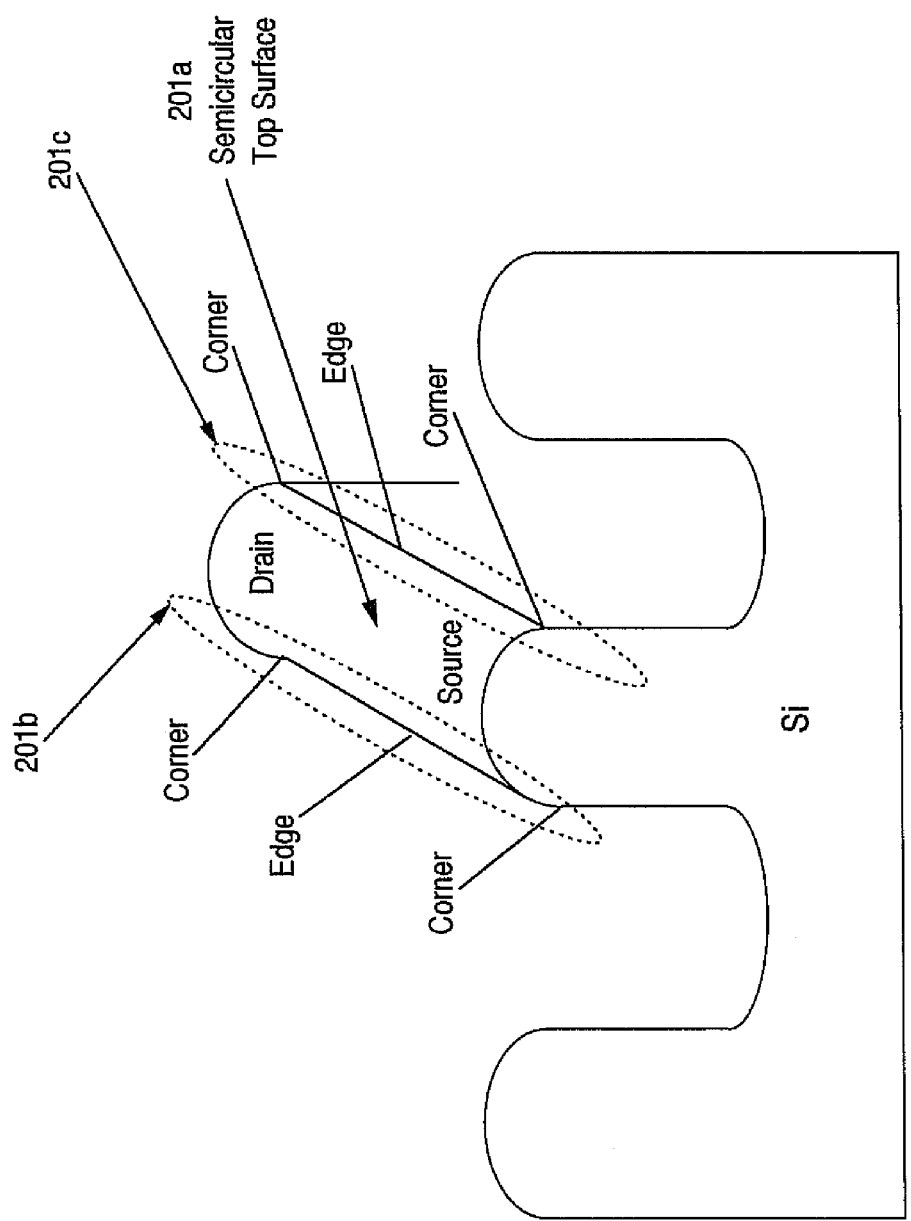
FIG. 2B shows a three-dimensional depiction of the FIN component of a memory cell that shows source and drain regions according to one embodiment.

FIG. 2B shows a three-dimensional depiction of the FIN component of memory cell 200 that shows its source and drain regions. As shown in FIG. 2B, as used herein the term "top corners" and "edges" is intended to refer to the top corners and edges 201b and 201c of FIN structure 201 in both source and drain regions of FIN structure 201(see encircled elements). In one embodiment, the semicircular top surface 201a with rounded edges is achieved through an annealing process. In one embodiment, the annealing process can be performed in a vacuum chamber and can include but is not limited to: (1) a dilute hydrofluoric acid (DHF) clean to expose the silicon surface of the silicon FIN, (2) an ammonia/peroxide mix (APM) and hydrochloric/peroxide mix (HPM) clean to form native oxide and (3) a 100 percent H2 anneal at 650 to 111 degrees Celsius. In addition, in one embodiment, the FIN structure 201 can be annealed at a pressure of .010 Torr to 100 Torr, with H2 flow rate of 50sccm to 20 slm for 2sec to 600 sec. In other embodiments, other anneal temperatures, pressures, anneal environments, and anneal times can be used.

In one embodiment, scaling is facilitated because of the elimination of breakdown at FIN structure top surfaced corners and edges that can be aggravated as the size of devices are reduced. Moreover, a more uniform flow of current is facilitated because of the optimized charge distribution in nitride charge storage layer 205 facilitated by exemplary embodiments.

FIG. 3 shows an array architecture 300 that employs memory cells such as are described with reference to FIG. 2A. Array 300 includes a plurality of the word lines 360 running in one direction and a plurality of overlying metal interconnects 302 running in the perpendicular direction. The metal interconnects 302 deliver a voltage to the underlying source/drain regions 358 through metal interconnects 304. FIG. 3 also shows two adjacent cells 354 labeled "cell 1" and "cell 2" in FIG. 3. The two cells 354 share a common source/drain region 358. The cells 354 of the present invention can be substituted in place of conventional memory cells.

Process Flow for Forming Memory Cells having FIN Structures with Semicircular Top Surfaces and Rounded Top Corners and Edges FIGS. 4A-4M show a series of cross sections illustrating the process flow involved in forming memory cells having FIN structures with semicircular top surfaces and rounded top corners and edges according to one embodiment of the invention is shown.

Figure 4A:
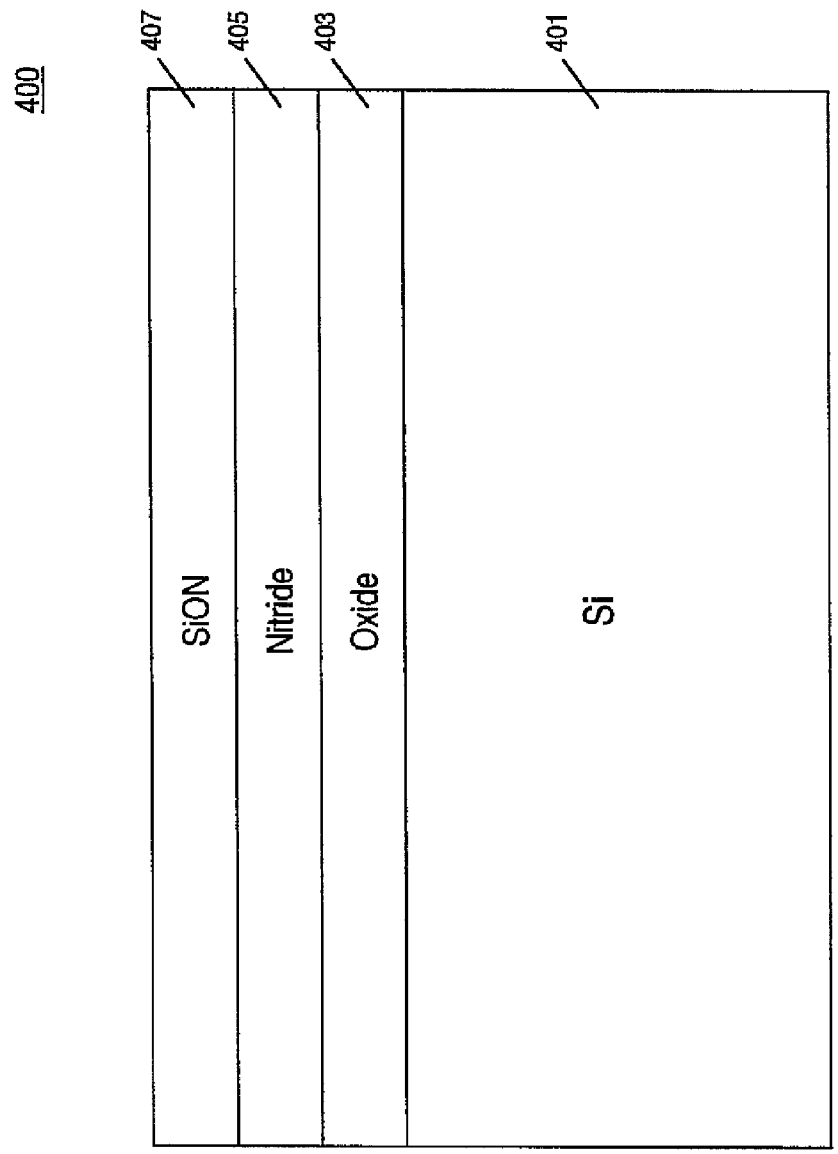
FIG. 4A shows a resultant cross sectional view subsequent to one or more operations in a process for forming a memory cell according to one embodiment of the present invention.

As shown in FIG. 4A, in initial operations a pad oxide layer 403, STI (shallow trench isolation) nitride layer 405 and SiON layer 407 are formed on a silicon substrate wafer 401.

Figure 4B:
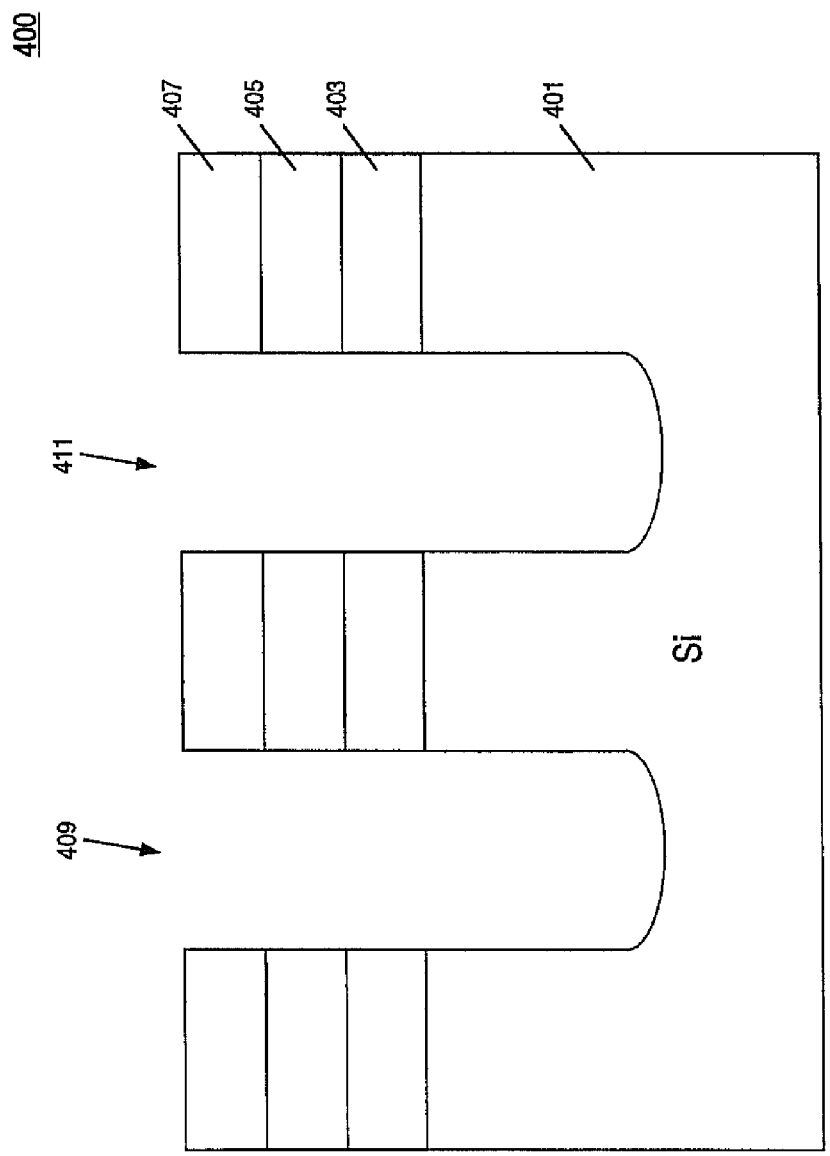
FIG. 4B shows a resultant cross sectional view subsequent to one or more operations in a process for forming a memory cell according to one embodiment of the present invention.

As shown in FIG. 4B, subsequent to one or more operations that result in the cross section shown in FIG. 4A, an SD (source-drain) mask is applied and an STI etch is performed that forms trenches 409 and 411.

Figure 4C:
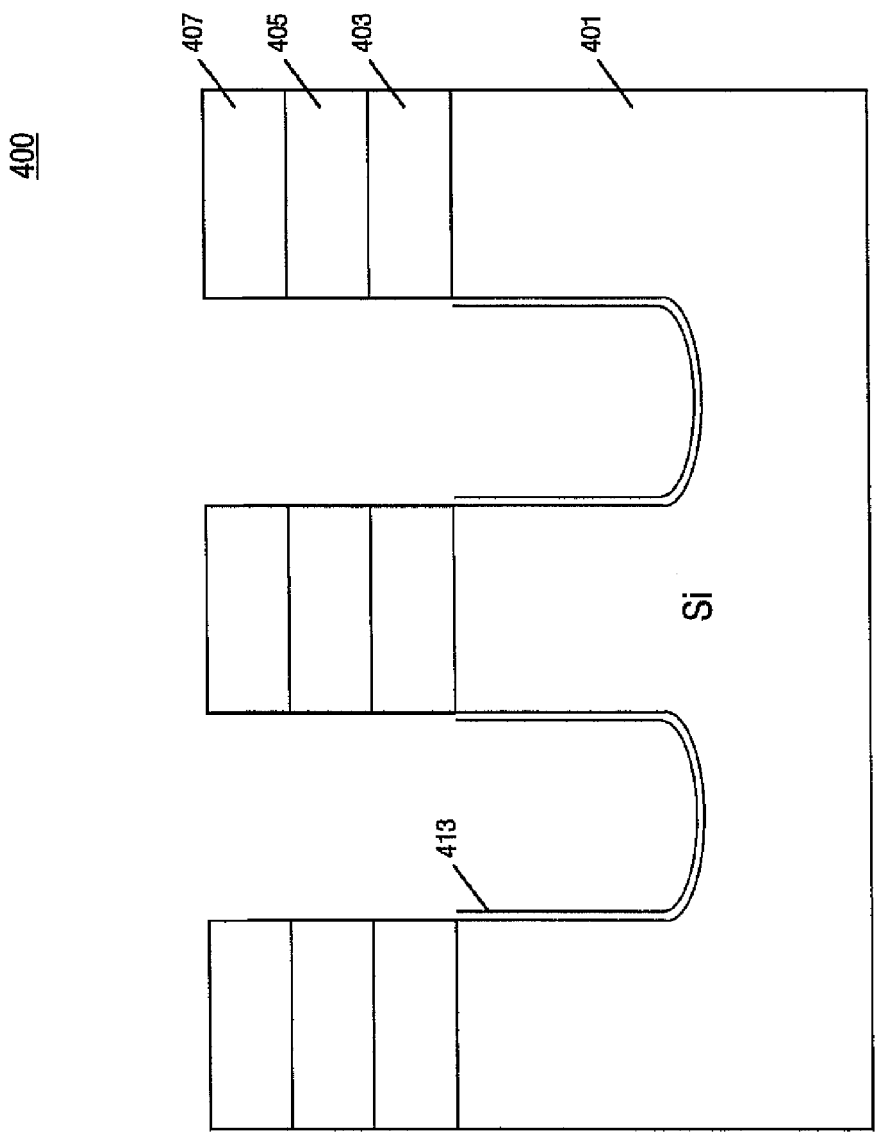
FIG. 4C shows a resultant cross sectional view subsequent to one or more operations in a process for forming a memory cell according to one embodiment of the present invention.

As shown FIG. 4C, subsequent to one or more operations that result in the cross section shown in FIG. 4B, a liner oxide 413 is formed in trenches 409 and 411 formed by the STI etch discussed with reference to FIG. 4B.

Figure 4D:
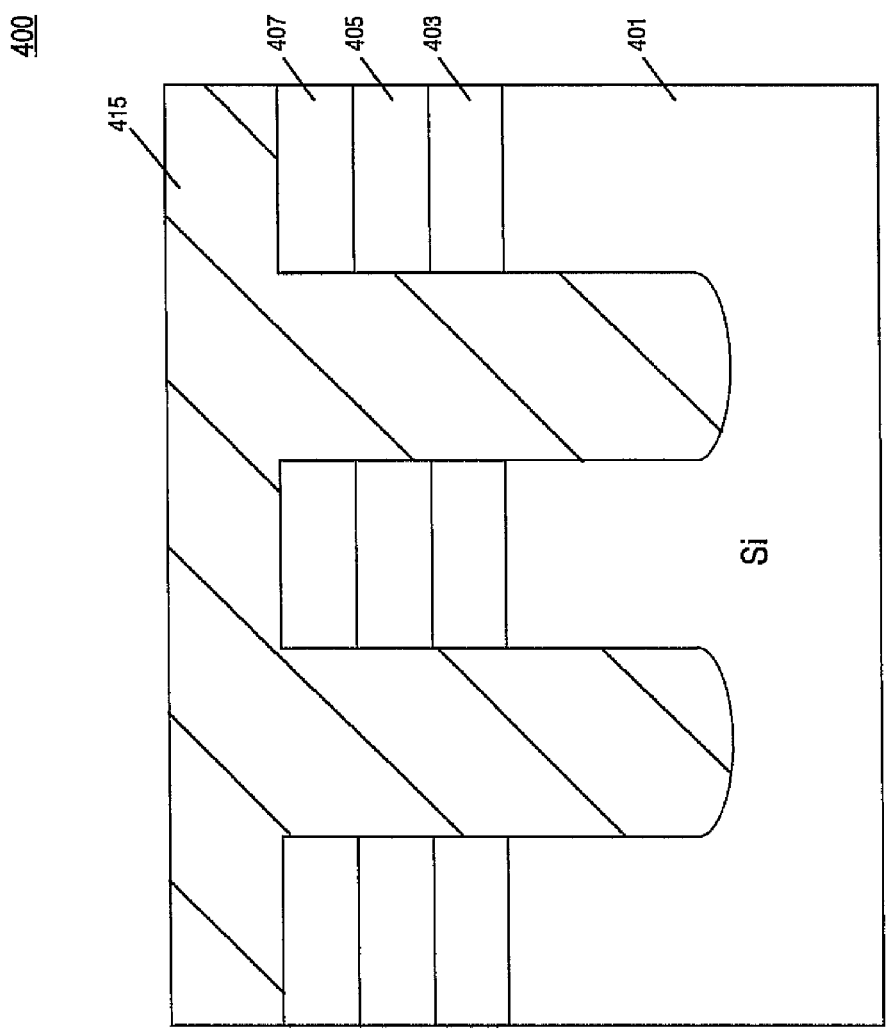
FIG. 4D shows a resultant cross sectional view subsequent to one or more operations in a process for forming a memory cell according to one embodiment of the present invention.

As shown in FIG. 4D, subsequent to the execution of one or more operations that result in the cross section shown in FIG.

4C, an STI oxide fill 415 is performed. In one embodiment the STI oxide fill 415 fills trenches 409 and 411 covers the surface of the semiconductor structure 400 under fabrication (see FIG. 4D).

Figure 4E:
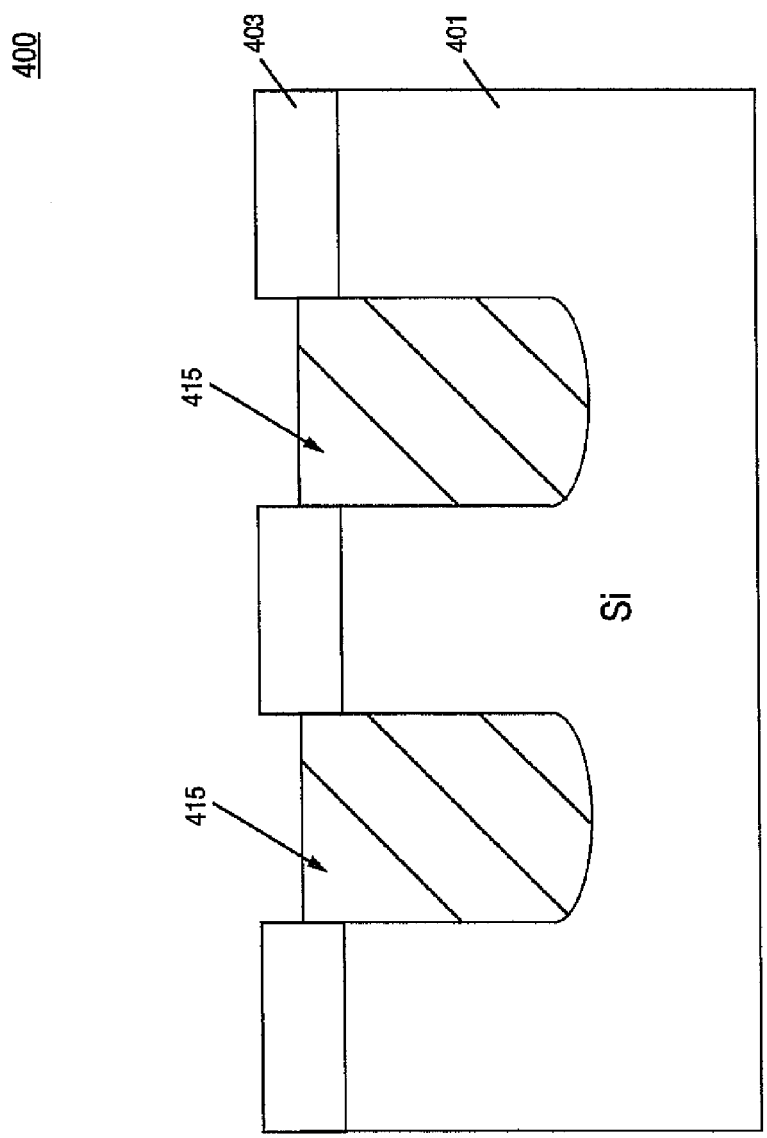
FIG. 4E shows a resultant cross sectional view subsequent to one or more operations in a process for forming a memory cell according to one embodiment of the present invention.
Figure 4F:
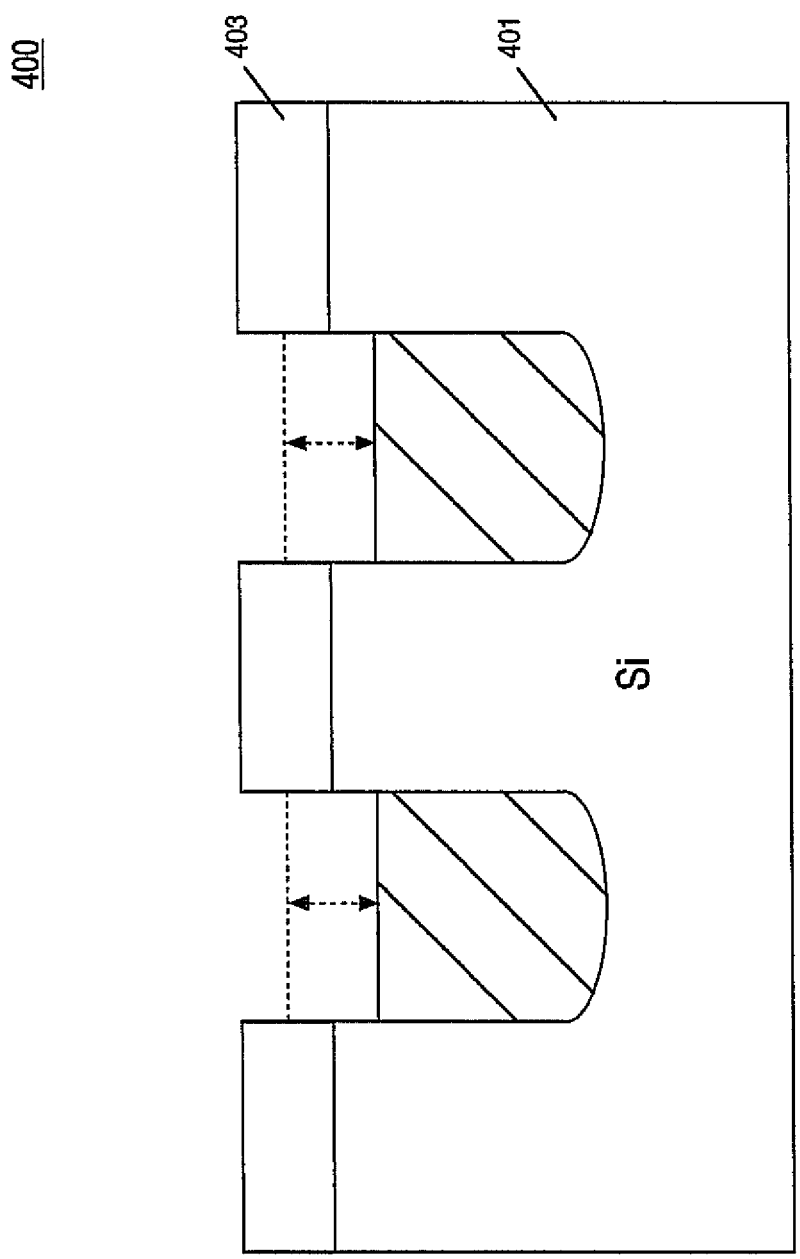
FIG. 4F shows a resultant cross sectional view subsequent to one or more operations in a process for forming a memory cell according to one embodiment of the present invention.

As shown in FIG. 4E, subsequent to the execution of one or more operations that result in the cross section shown in FIG. 4D, an STI CMP (chemical mechanical polishing) operation is performed. In one embodiment, the STI CMP operation removes the portion of oxide fill 415 that covers the surface of structure 400 in addition to SiON layer 407. As shown in FIG. 4F, subsequent to the execution of one or more operations that result in the cross section shown in FIG. 4E, a first STI oxide recess is performed. Referring to FIG. 4F, the recessing of the oxide in trenches 409 and 411 is illustrated by the arrows and dashed line.

Figure 4G:
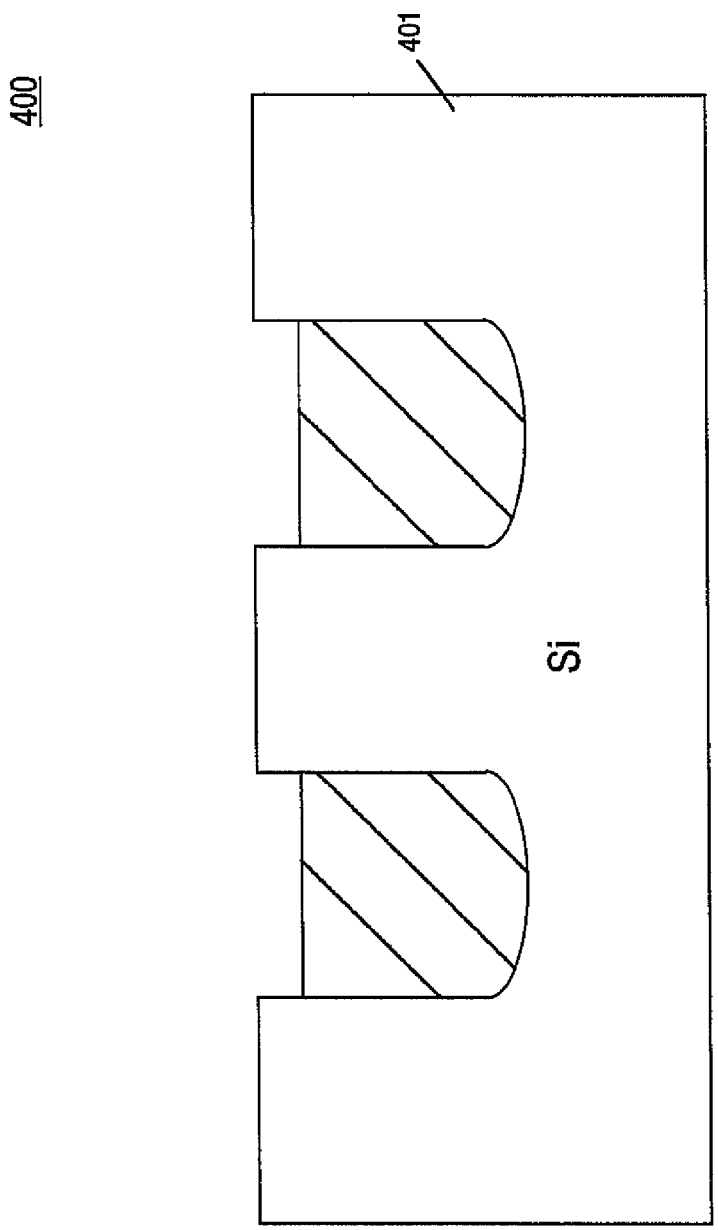
FIG. 4G shows a resultant cross sectional view subsequent to one or more operations in a process for forming a memory cell according to one embodiment of the present invention.

As shown in FIG. 4G, subsequent to the execution of one or more operations that result in the cross section shown in FIG. 4F, pad oxide layer 403 is removed.

Figure 4H:
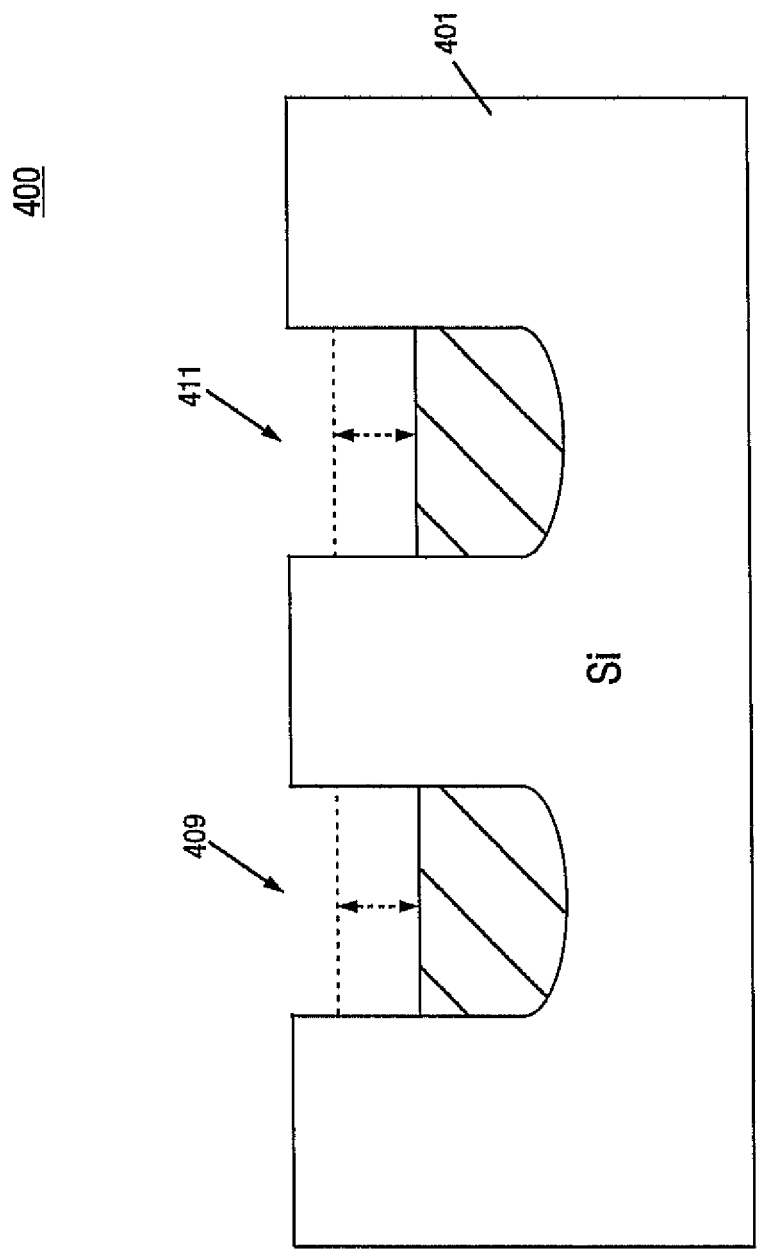
FIG. 4H shows a resultant cross sectional view subsequent to one or more operations in a process for forming a memory cell according to one embodiment of the present invention.

As shown in FIG. 4H, subsequent to the execution of one or more operations that result in the cross section shown in FIG. 4G, a second STI oxide recess is performed. Referring to FIG. 4H, the recessing of the oxide in trenches 409 and 411 is illustrated by the arrows and the dashed line.

Figure 4I:
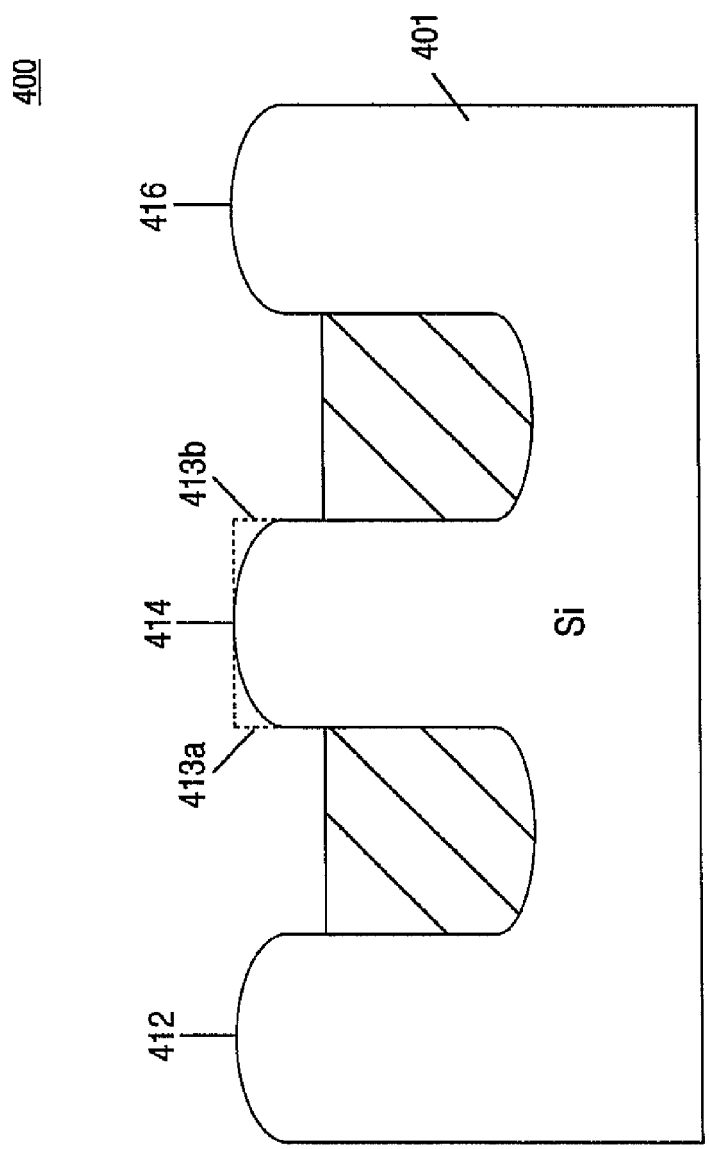
FIG. 4I shows a resultant cross sectional view subsequent to one or more operations in a process for forming a memory cell according to one embodiment of the present invention.

As shown in FIG. 4I, subsequent to the execution of one or more operations that result in the cross section shown in FIG. 4H, an H2 anneal is performed to round-off the SD top surface corners 413a and 413b of the FIN structures 412, 414 and 416 (see dashed line depiction of eliminated surface corners). In one embodiment, these operations result in a FIN structure that has a top surface with a semicircular shape and rounded edges and corners. In one embodiment, the anneal includes: (1) a DHF clean to expose Si surface along Si film, (2) an APM and HPM clean to form native oxide and (3) 100 percent H2 anneal at 650-1100 C.

Figure 4J:
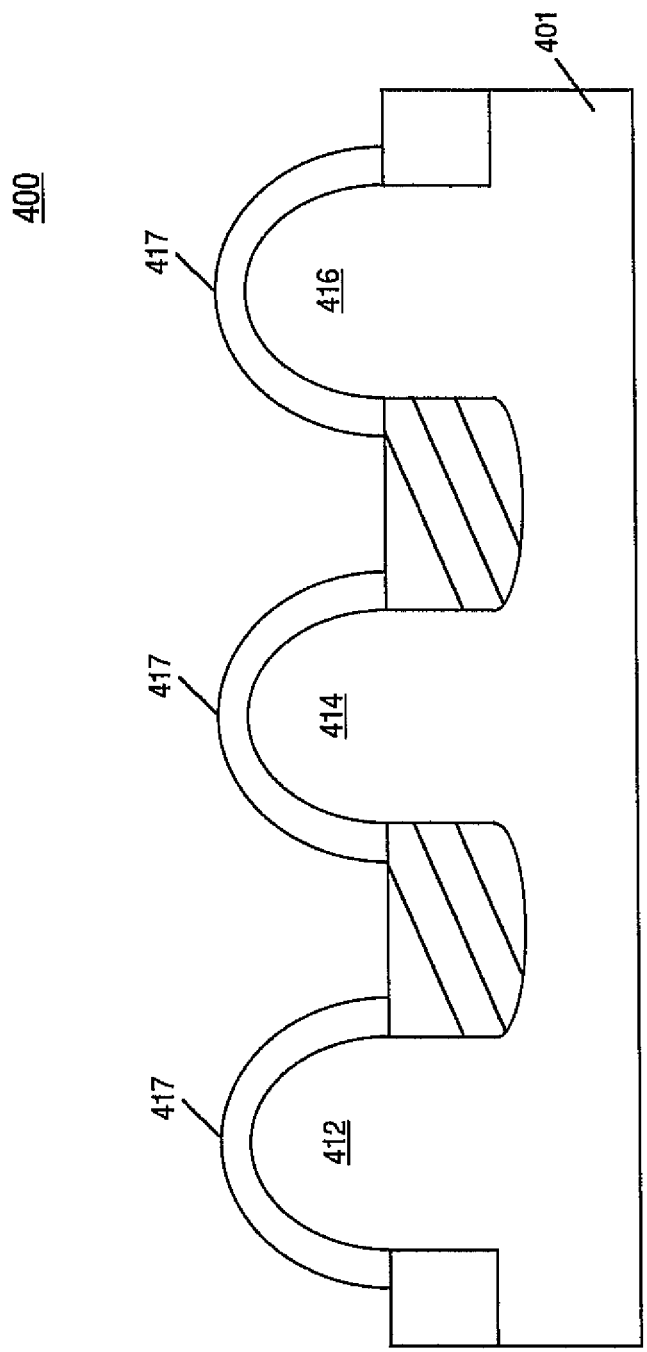
FIG. 4J shows a resultant cross sectional view subsequent to one or more operations in a process for forming a memory cell according to one embodiment of the present invention.

As shown in FIG. 4J, subsequent to the execution of one or more operations that result in the cross section shown in FIG. 4I, a bottom oxide 417 is formed over the FIN structures. In one embodiment, bottom oxide 417 is a tunnel oxide that forms an interface with the FIN structures (e.g., 412, 414 and 416).

Figure 4K:
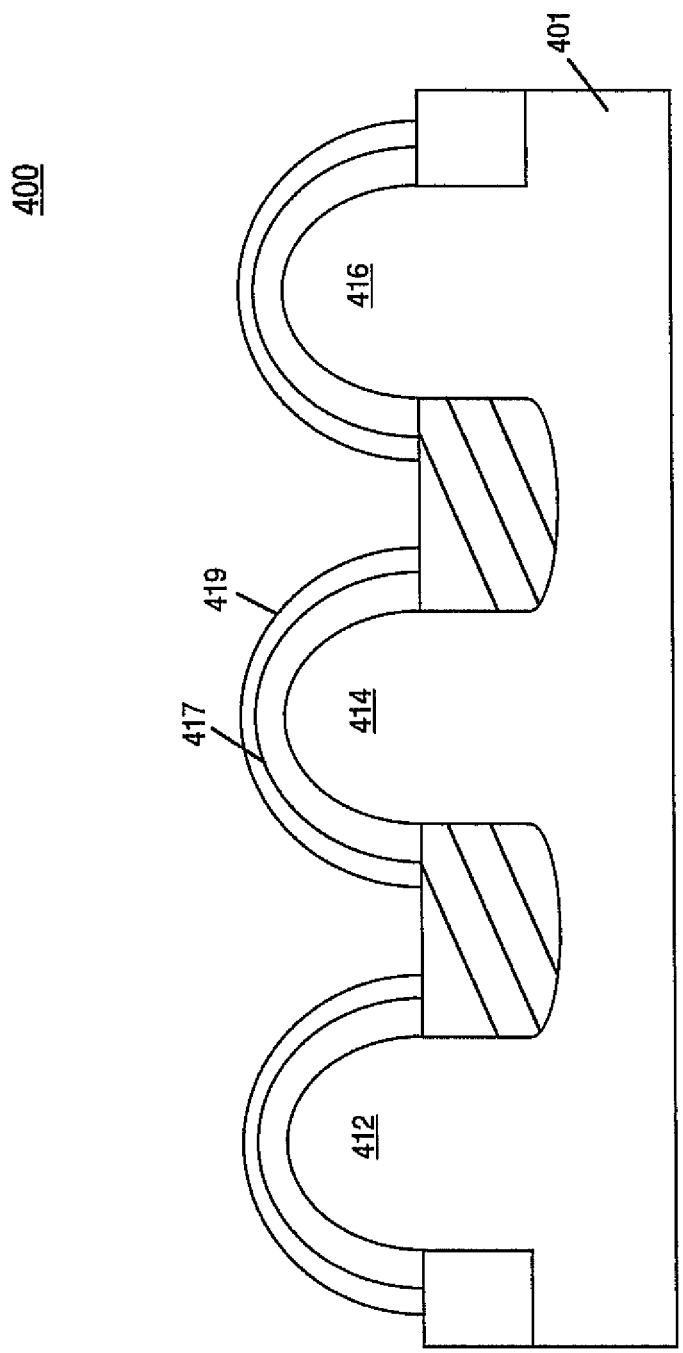
FIG. 4K shows a resultant cross sectional view subsequent to one or more operations in a process for forming a memory cell according to one embodiment of the present invention.

As shown in FIG. 4K, subsequent to the execution of one or more operations that result in the cross section shown in FIG. 4J, an ONO nitride trapping layer 419 is formed over bottom oxide 417. In one embodiment, nitride trapping layer 419 forms the charge storing element of the completed memory cell structure.

Figure 4L:
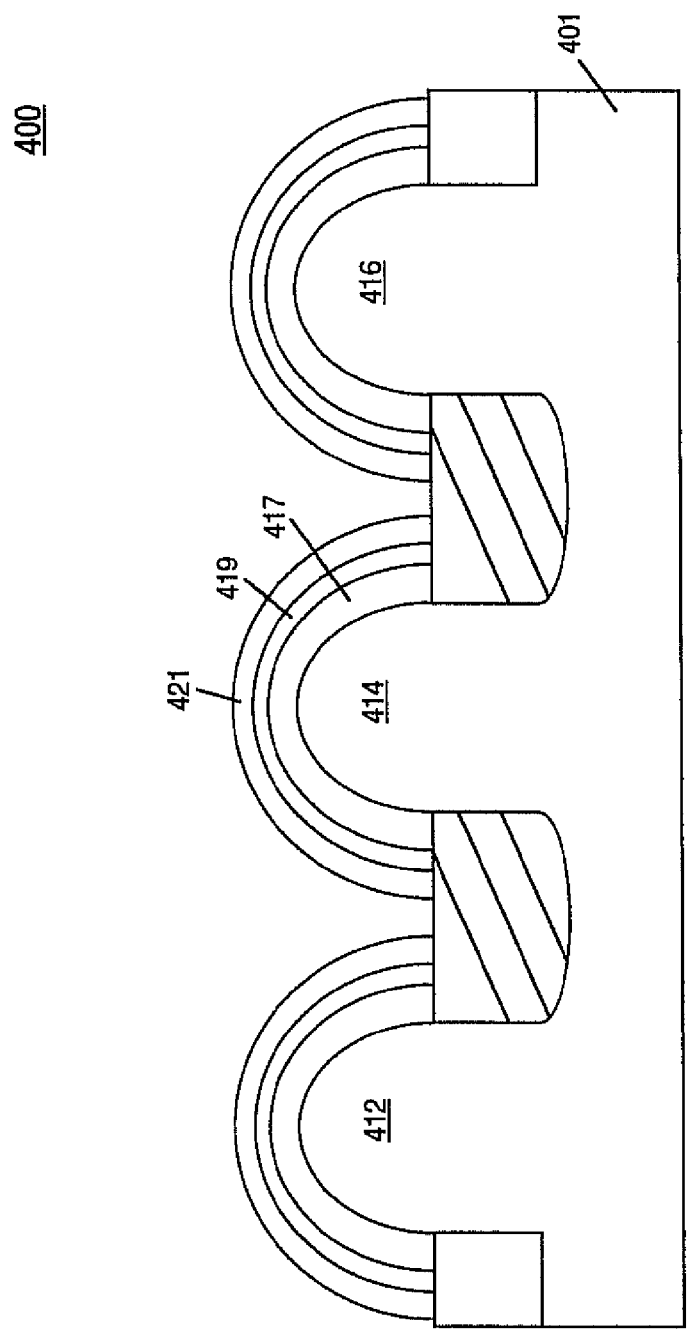
FIG. 4L shows a resultant cross sectional view subsequent to one or more operations in a process for forming a memory cell according to one embodiment of the present invention.

As shown in FIG. 4L, subsequent to the execution of one or more operations that result in the cross section shown in FIG. 4K, an ONO top oxide layer 421 is formed over the ONO nitride trapping layer 419.

Figure 4M:
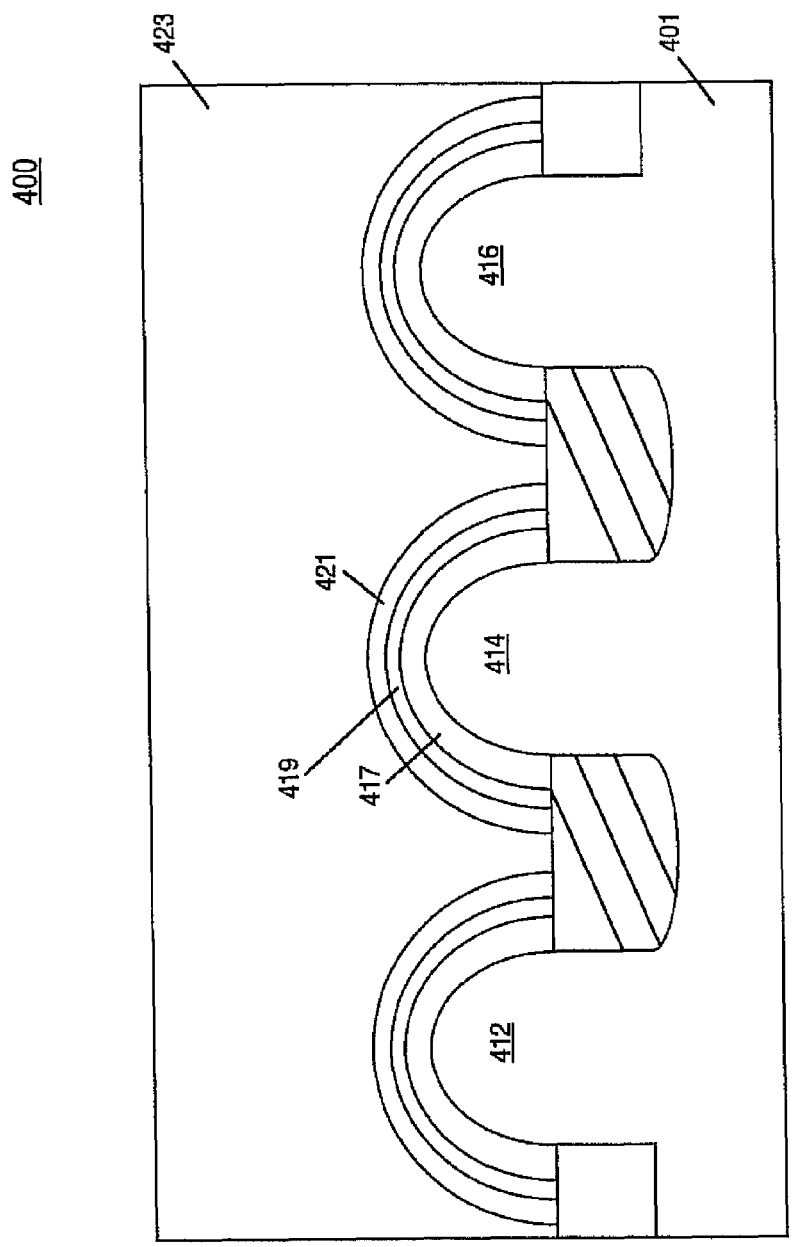
FIG. 4M shows a resultant cross sectional view subsequent to one or more operations in a process for forming a memory cell according to one embodiment of the present invention.

As shown in FIG. 4M, subsequent to the execution of one or more operations that result in the cross section shown in FIG. 4L, a polycrystalline layer 423 is formed over the ONO top oxide layer 421.

Exemplary Advantages
Semicircular FIN Top Surface Structure

In one embodiment, a charge storage cell structure that features a FIN structure (201 in FIG. 2A) that has a semicircular top surface with rounded corners and edges is provided. It should be appreciated, as previously discussed herein, that even though an electric field may be uniformly applied to the FIN component of a transistor formed conventionally during normal operation of the transistor, the electric field that results can be concentrated or more intense at sharp corners and edges of the FIN structure. As a result the likelihood of breakdown at such points is greater. Breakdown can cause a loss of charge for the charge storage cell structure. As a result, programmed data stored therein can be lost.

In one embodiment, as discussed above with reference to FIG. 4B, the annealing operations described herein are performed to shape the top surface of the FIN structure into a semicircular form an cause the top corners and edges of the FIN structure to be rounded. As discussed above, in order to accomplish this, in one embodiment, a hydrogen anneal is performed that includes: (1) a DHF clean to expose Si surface along Si film, (2) an APM and HPM clean to form native oxide and (3) a 100 percent H2 anneal at 650-1110 C. In other embodiments, other annealing process can be used. Importantly, the annealing process, through the creation of a semicircular FIN top surface, eliminates the sharp corners and edges that are typical at the top surfaces of conventional FIN structures that can promote breakdown.

Resistant to Breakdown

In one embodiment, a FIN charge cell structure (e.g., 200 in FIG. 2A) that is resistant to breakdown of the bottom oxide at the top surface corners and edges (e.g., 201b and 201c in FIG. 2A) of the associated FIN structure is provided. Because early breakdown of the bottom oxide at such top surface corners and edges can be caused by the enhanced intensity and concentration of an applied electric field at these points as discussed above, device operation can be degraded. In one embodiment, the above discussed rounding of the top surface of the FIN structure into a semicircular form and the elimination of sharp top surface corners and edges provide the device with a robust resistance to the breakdown of the bottom oxide.

Uniform Tunnel Oxide Coverage

In one embodiment, uniform tunnel oxide (e.g., bottom oxide) coverage is provided. Because growth rate can be non-uniform the oxide formation at corners can be thinner than at other points. As a result the likelihood of breakdown at such points is greater. The semicircular FIN structure top surface and the rounded top surface corners and edges of exemplary embodiments facilitate more uniform tunnel oxide coverage.

Figure 5:
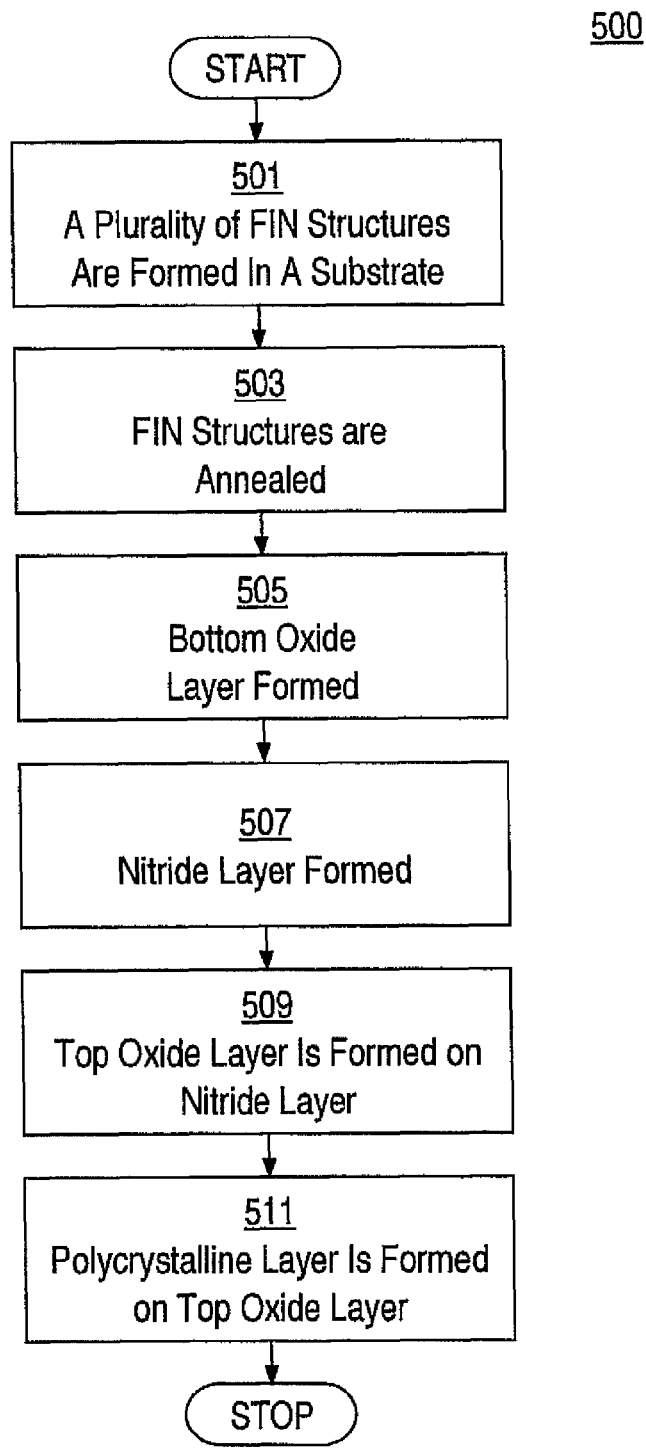
FIG. 5 shows a flowchart of the steps performed in a method for fabricating FIN structures with semicircular top surfaces and rounded top corners and edges according to one embodiment.

Exemplary Operations for Fabricating Memory Cells having FIN Structures with Semicircular Top Surfaces and Rounded Top Corners and Edges FIG. 5 shows a flowchart 500 of the steps performed in a method for fabricating memory cells having FIN structures with semicircular top surfaces with rounded top corners and edges according to one embodiment. In one embodiment, the fabrication of the memory cells can be a part of a larger process for fabricating a memory cell array. Although specific steps are disclosed in the flowcharts, such steps are exemplary. That is the present invention is well suited to performing various other steps or variations of the steps recited in the flowcharts.

Referring to FIG. 5, at 501 in an initial operation a plurality of FIN structures are formed in a substrate wafer.

At 503, the plurality of FIN structures are annealed. In one embodiment, these operations result in a FIN structure that has a top surface with a semicircular shape with rounded top corners and edges. In one embodiment, a hydrogen anneal is performed that can include but is not limited to: (1) a DHF clean to expose Si surface along Si film, (2) APM and HPM clean to form native oxide and (3) 100 percent H2 anneal at 650-1100 C.

At 505, a bottom oxide layer is formed over the FIN structures. In one embodiment, the bottom oxide (e.g., 417 in FIG. 4J) is a tunnel oxide that forms an interface with the FIN structure.

At 507, a nitride charge trapping layer is formed over the bottom oxide layer. In one embodiment, the nitride charge trapping layer (e.g., 419 in FIG. 4K) forms the charge storing element of the completed memory cell structure.

At 509, a top oxide layer is formed over the nitride charge trapping layer. And, at 511, a polycrystalline silicon layer is formed over the top oxide layer.

With reference to exemplary embodiments thereof, methods for fabricating a FIN structure with semicircular top surface and rounded top surface corners and edges are disclosed. As a part of a disclosed method, a FIN structure is formed in a semiconductor substrate. The FIN structure includes a top surface having corners and edges. The FIN structure is annealed where the annealing causes the top surface to have a semicircular shape and the top surface corners and edges to be rounded.

Although many of the components and processes are described above in the singular for convenience, it will be appreciated by one of skill in the art that multiple components and repeated processes can also be used to practice the techniques of the present invention. Further, while the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

We claim:

1. A method for forming a FIN structure with semicircular top surface and rounded top surface corners and edges, comprising:
   forming a FIN structure in a semiconductor substrate wherein said FIN structure includes a top surface having corners and edges; and
   annealing said FIN structure to effect an initiation and completion of rounding for said method of said top surface corners and edges in a single annealing operation free of any preceding, intermediate and subsequent rounding operations that round said top surface corners and edges in part wherein said single annealing operation causes the top surface area between said corners and edges to have a semicircular shape along the entire surface between anterior and posterior portions of said FIN in a direction orthogonal to the direction between said edges wherein said annealing comprises initially performing a dilute hydrofluoric acid (DHF) clean, and subsequently performing simultaneously both an ammonia/peroxide mix (APM) clean and hydrochloric/peroxide mix (HPM) clean to form native oxide and a H2 anneal.

2. The method of claim 1 wherein said FIN structure is associated with the fabrication of an individual charge storage cell.

3. The method of claim 1 wherein said FIN structure is fabricated from a semiconductor wafer.

4. The method of claim 1 wherein said annealing is performed at a temperature of 650 to 1100 degrees Celsius.

5. The method of claim 1 wherein said annealing is performed at a pressure of 0.1 Torr to 100 Ton.

6. The method of claim 1 wherein said annealing is performed using an H2 flow of 50 sccm to 20 slm.

7. The method of claim 1 wherein said annealing time is 2 seconds to 600 seconds.

8. A method for forming a storage element, comprising:
   forming a FIN structure on a semiconductor substrate wherein said forming said FIN structure comprises:
      forming a semiconductor FIN structure wherein said semiconductor FIN structure includes a top surface having corners and edges; and
      annealing said semiconductor FIN structure to effect the initiation and completion of rounding of said top surface corners and edges for said method in a single annealing operation free of preceding, intermediate and subsequent rounding operations that round said top surface corners and edges in part wherein said single annealing operation causes the top surface area between said corners and edges to have a semicircular shape along the entire surface between anterior and posterior portions of said FIN in a direction orthogonal to the direction between said edges wherein said annealing comprises initially performing a dilute hydrofluoric acid (DHF) clean, and subsequently performing simultaneously both an ammonia/peroxide mix (APM) clean and hydrochloric/peroxide mix (HPM) clean to form native oxide and a H2 anneal, forming a first oxide layer on said semiconductor FIN structure;
   forming a charge storage layer on said first oxide layer;
   forming a second oxide layer on said charge storage layer; and
   forming a polysilicon gate layer on said second oxide layer.

9. The method of claim 8 wherein each of said FIN structures are associated with the fabrication of an individual charge storage cell.

10. The method of claim 8 wherein said FIN structure is formed from a semiconductor wafer.

11. The method of claim 8 wherein said annealing is performed at a temperature of 650 to 1100 degrees Celsius.

12. The method of claim 8 wherein said annealing is performed at a pressure of 0.1 Torr to 100 Ton.

13. The method of claim 8 wherein said annealing is performed using an H2 flow of 50 sccm to 20 slm.

14. The method of claim 8 wherein said annealing time is 2 seconds to 600 seconds.

15. A method for forming a memory array comprising:
   forming a semiconductor substrate; and
   forming a plurality of storage elements on said semiconductor substrate, comprising:
      forming a plurality of semiconductor FIN structures wherein said plurality of semiconductor FIN structures include a top surface having corners and edges; and
      annealing the plurality of semiconductor FIN structures to effect the initiation and completion of rounding of said top surface corners and edges for said method in a single annealing operation free of preceding, intermediate and subsequent rounding operations that round said top surface corners and edges in part wherein said single annealing operation causes the top surface area between said corners and edges to have a semicircular shape along the entire surface between anterior and posterior portions of said FIN in a direction orthogonal to the direction between said edges wherein said annealing comprises initially performing in a dilute hydrofluoric acid (DHF) clean, and subsequently performing simultaneously both an ammonia/peroxide mix (APM) clean and hydrochloric/peroxide mix (HPM) clean to form native oxide and a H2 anneal, forming a first oxide layer on said plurality of semiconductor FIN structures;

forming a charge storage layer on said first oxide layer; and forming a second oxide layer on the charge storage layer.

16. The method of claim 15 wherein each of said FIN structures are associated with the fabrication of an individual charge storage cell.

\* \* \* \* \*